US010656215B2

United States Patent
Horai et al.

(10) Patent No.: US 10,656,215 B2
(45) Date of Patent: May 19, 2020

(54) SHORT CIRCUIT DETECTION DEVICE

(71) Applicant: Nissan Motor Co., Ltd., Yokohama-shi, Kanagawa (JP)

(72) Inventors: Atsushi Horai, Kanagawa (JP); Gentaro Kano, Kanagawa (JP); Hiroyuki Tanaka, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 16/346,883

(22) PCT Filed: Nov. 7, 2016

(86) PCT No.: PCT/JP2016/082998
§ 371 (c)(1),
(2) Date: May 2, 2019

(87) PCT Pub. No.: WO2018/083802
PCT Pub. Date: May 11, 2018

(65) Prior Publication Data
US 2020/0064409 A1     Feb. 27, 2020

(51) Int. Cl.
*G01R 31/389* (2019.01)
*G01R 31/3842* (2019.01)
*H01M 10/48* (2006.01)

(52) U.S. Cl.
CPC ....... *G01R 31/389* (2019.01); *G01R 31/3842* (2019.01); *H01M 10/48* (2013.01)

(58) Field of Classification Search
CPC .. G01R 31/389; G01R 31/382; G01R 31/385; G01R 31/3828; G01R 19/0084;
(Continued)

(56) References Cited

U.S. PATENT DOCUMENTS

| 8,643,332 B2 | 2/2014 | Yokotani |
| 2009/0155674 A1 | 6/2009 | Ikeuchi et al. |

(Continued)

FOREIGN PATENT DOCUMENTS

| CN | 1821801 A | 8/2006 |
| CN | 101790691 A | 7/2010 |

(Continued)

OTHER PUBLICATIONS

Liao et al., "Three-color photodetector based on quantum dots and resonant-tunneling diodes coupled with conductive polymers", Solid-State Electrics, Oct. 2010, pp. 1066-1070, vol. 54, Issue 10, Elsevier Science Publishers, UK.

(Continued)

*Primary Examiner* — Son T Le
(74) *Attorney, Agent, or Firm* — Global IP Counselors, LLP

(57) ABSTRACT

A short circuit detection device has a voltage sensor and a control unit. The voltage sensor detects a voltage of a secondary battery. The control unit determines whether a first voltage value of the voltage of the secondary battery discharging to a load is below a threshold value. Upon determining the first voltage value is below the threshold value, the control unit adjusts the load to reduce the current that flows from the secondary battery to the load. The control unit then determines whether a second voltage value of the voltage of the secondary battery after the adjustment of the load is less than the first voltage value. Upon determining the second voltage value is less than the first voltage value, control unit recognizes that an internal short circuit of the secondary battery has occurred.

5 Claims, 5 Drawing Sheets

(58) Field of Classification Search
CPC .... G01R 19/165; G01R 19/15; G01R 19/155; G01R 19/16542; G01R 31/3842; G01R 31/36; G01R 17/20; G01R 19/16566; G01R 19/16571; G01R 19/1659; H01M 10/48
See application file for complete search history.

(56) References Cited

U.S. PATENT DOCUMENTS

| | | | |
|---|---|---|---|
| 2010/0188054 A1 | 7/2010 | Asakura et al. | |
| 2010/0201321 A1 | 8/2010 | Asakura et al. | |
| 2015/0355288 A1* | 12/2015 | Yokoyama | H01M 10/4285 702/63 |
| 2016/0161564 A1 | 6/2016 | Kurihara et al. | |
| 2017/0264104 A1* | 9/2017 | Horitake | B60L 58/21 |

FOREIGN PATENT DOCUMENTS

| | | |
|---|---|---|
| CN | 102187504 A | 9/2011 |
| CN | 105026945 A | 11/2015 |
| CN | 105244850 A | 1/2016 |
| CN | 105324897 A | 2/2016 |
| CN | 105393426 A | 3/2016 |
| JP | 2000-182598 A | 6/2000 |
| JP | 2002-50410 A | 2/2002 |
| JP | 2007-187533 A | 7/2007 |
| JP | 2010-123565 A | 6/2010 |
| JP | 2010-536133 A | 11/2010 |
| JP | 2012-52857 A | 3/2012 |
| JP | 2013242324 A * | 7/2013 |
| JP | 2016-90399 A | 5/2016 |

OTHER PUBLICATIONS

Kim et al., "Nitride-organic semiconductor hybrid heterostructures for optoelectronic devices", Physica Status Solidi, May 31, 2007, pp. 2411-2414, vol. 4, Issue 7, Wiley-VCH, Germany.

* cited by examiner

SHORT CIRCUIT DETECTION DEVICE

CROSS-REFERENCE TO RELATED APPLICATIONS

This application is a U.S. national stage application of International Application No. PCT/JP2016/082998, filed on Nov. 7, 2016.

BACKGROUND

Technical Field

The present invention relates to a short circuit detection device for detecting an internal short circuit of a secondary battery.

Background Information

In recent years, the development of electric vehicles (EV) and hybrid vehicles (HEV) has accompanied the rise of the environmental protection movement. Lithium-ion secondary batteries that can be repeatedly charged and discharged are attracting attention as a power source for the motors that drive these vehicles.

For example, if an external mechanical shock were applied to a lithium-ion secondary battery, there are cases in which an internal short circuit would occur in the lithium-ion secondary battery. An internal short circuit of the lithium-ion secondary battery may reduce the performance of the lithium-ion secondary battery and is thus undesirable.

In relation to the foregoing, Japanese Laid-Open Patent Application No. 2016-090399 (Patent Document 1) proposes a technique for determining whether an internal short circuit of a lithium-ion secondary battery has occurred by considering a value obtained by subtracting a theoretical value of capacity change from an actually measured value of the change in capacity of a lithium-ion secondary battery as the capacity consumed by an internal short circuit. By means of this technique, an internal short circuit of the lithium-ion secondary battery during discharge can be detected in real time.

SUMMARY

In the technique described above, an open-circuit voltage of the lithium-ion secondary battery is calculated in order to obtain the theoretical value of the change in capacity of the lithium-ion secondary battery. The open-circuit voltage is calculated based on the closed-circuit voltage by measuring the closed-circuit voltage of the lithium ion secondary battery. In this case, a change in the internal resistance of the lithium-ion secondary battery taken into consideration.

Changes in the internal resistance of the lithium-ion secondary battery can be accurately estimated as long as there is a steady discharge. However, in a system in which a fluctuating discharge occurs, such as an electric vehicle, it is difficult to accurately estimate changes in the internal resistance of the lithium-ion secondary battery. For this reason, with the foregoing technique, when the lithium-ion secondary battery is used in a system in which a fluctuating discharge occurs, there is the problem that the open-circuit voltage is not accurately calculated and that the internal short circuit cannot be accurately detected.

The present invention was made to solve the problem described above. Accordingly, an object of the present invention is to provide a short circuit detection device that can accurately detect in real time the internal short circuit of a secondary battery during discharge, regardless of the mode of use of the secondary battery.

The above-described objects of the present invention can be achieved by the following.

The short circuit detection device according to the present invention determines whether a first voltage value, obtained by detecting with a voltage sensor a voltage of a secondary battery that is discharging to a load, is below a threshold value, and, if the first voltage value is below the threshold value, the short circuit detection device adjusts the load to reduce the current that flows from the secondary battery to the load. The short circuit detection device according to the present invention then determines whether a second voltage value, obtained by detecting with a voltage sensor the voltage of the secondary battery after the adjustment of the load, is less than the first voltage value, and, if the second voltage value is less than the first voltage value, the short circuit detection device recognizes that the secondary battery has an internal short circuit.

The short circuit detection device according to the present invention determines whether a voltage value obtained by detecting with a voltage sensor a voltage of a secondary battery that is discharging to a load, is below a first threshold value, and calculates an amount of change in the voltage of the secondary battery per unit time. The short circuit detection device according to the present invention then determines whether the amount of change per unit time exceeds a second threshold value, and, if the amount of change exceeds the second threshold value, the short circuit detection device recognizes that the secondary battery has an internal short circuit.

The short circuit detection device according to the present invention detects with a voltage sensor a voltage of a secondary battery that is discharging to a load and calculates a voltage fluctuation frequency, and detects with a current sensor the current that flows from the secondary battery to the load and calculates the current fluctuation frequency. The short circuit detection device according to the present invention then determines whether the voltage fluctuation frequency is greater than the current fluctuation frequency, and, if the voltage fluctuation frequency is greater than the current fluctuation frequency, the short circuit detection device recognizes that the secondary battery has an internal short circuit.

With the present invention, it is possible to accurately detect in real time an internal short circuit of a secondary battery during discharge, regardless of the mode of use of the secondary battery.

DETAILED DESCRIPTION OF THE EMBODIMENTS

Figure 1:
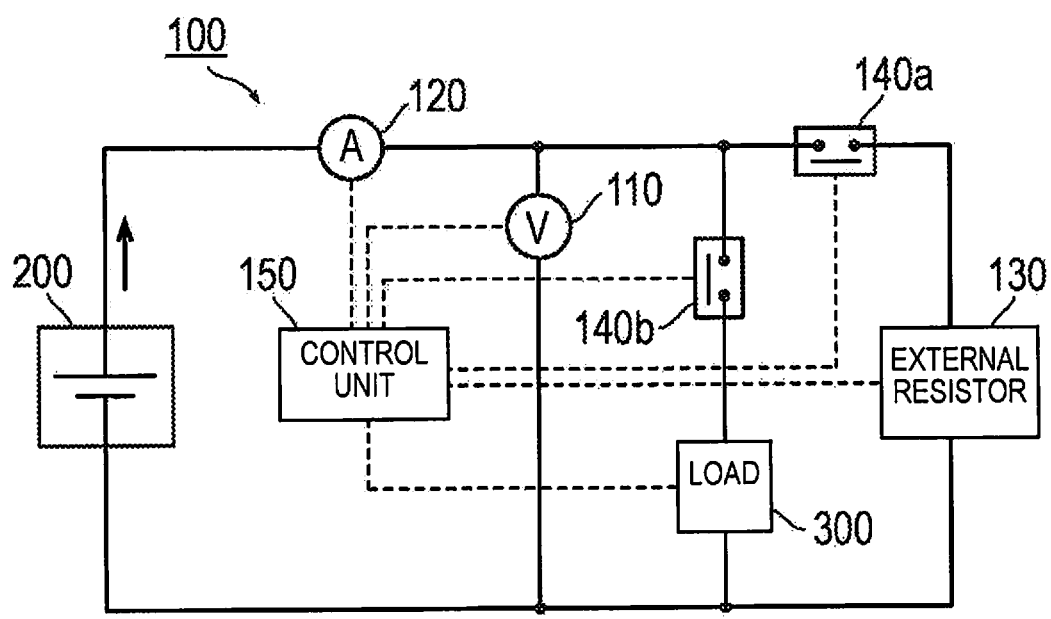
FIG. 1 is a view illustrating a schematic configuration of a short circuit detection device according to a first embodiment.

An embodiment of the present invention will be described below with reference to the drawings. The dimensional ratios in the drawings may be exaggerated for the sake of convenience of explanation and may differ from the actual ratios.

First Embodiment

FIG. 1 is a schematic diagram of a short circuit detection device 100 according to a first embodiment of the present invention. The short circuit detection device 100 of the present embodiment detects an internal short circuit that occurs in a secondary battery 200 that is discharging to a load 300. The secondary battery 200 is, for example, a lithium-ion secondary battery. Examples of the load 300 include a motor or various electronic devices that operate by being supplied electric power from the secondary battery 200.

As shown in FIG. 1, the short circuit detection device 100 comprises a voltage sensor 110, a current sensor 120, an external resistor 130, a switch 140, and a control unit 150.

The voltage sensor 110 is connected in parallel with the secondary battery 200 and detects the cell voltage of the secondary battery 200. The voltage value obtained by the detection of the cell voltage of the secondary battery 200 with the voltage sensor 110 is transmitted to the control unit 150.

The current sensor 120 is provided between the secondary battery 200 and the load 300 and detects the current that flows from the secondary battery 200 to the load 300. The current value obtained by the detection of the current with the current sensor 120 is transmitted to the control unit 150.

The external resistor 130 is connected in parallel with the secondary battery 200 and discharges the electric power of the secondary battery 200. The external resistor 130 is, for example, a discharge resistor circuit that discharges the electric power of the secondary battery 200 by consuming the electric power of the secondary battery 200.

The switch 140 includes a first switch 140a provided between the secondary battery 200 and the external resistor 130, and a second switch 140b provided between the secondary battery 200 and the load 300. The first and second switches 140a, 140b are, for example, relay switches. By the switching of the on/off states of the first and second switches 140a, 140b, a first state, in which the secondary battery 200 and the load 300 are connected, and a second state, in which the secondary battery 200 and the external resistor 130 are connected, are switched.

The control unit 150 controls the operation of each element described above. The control unit 150 comprises a CPU (Central Processing Unit) and various memories and controls the operations of the external resistor 130, the switch 140, and the load 300 in accordance with a program.

The control unit 150 according to the present embodiment functions as a first determination unit, a load adjustment unit, a second determination unit, and a recognition unit by the CPU executing a corresponding program. Here, the first determination unit determines whether a first voltage value, obtained by detecting with the voltage sensor 110a the cell voltage of the secondary battery 200 that is discharging to the load 300, is below a threshold value. If the first voltage value is determined to be below the threshold value, the load adjustment unit adjusts the load 300 to reduce the current that flows from the secondary battery 200 to the load 300. The second determination unit determines whether a second voltage value, obtained by detecting with the voltage sensor 110 the cell voltage of the secondary battery 200 after the load adjustment, is less than the first voltage value. If the second voltage value is determined to be less than the first voltage value, the recognition unit recognizes that the secondary battery 200 has an internal short circuit. The specific processing content of each unit will be described further below.

Figure 2:
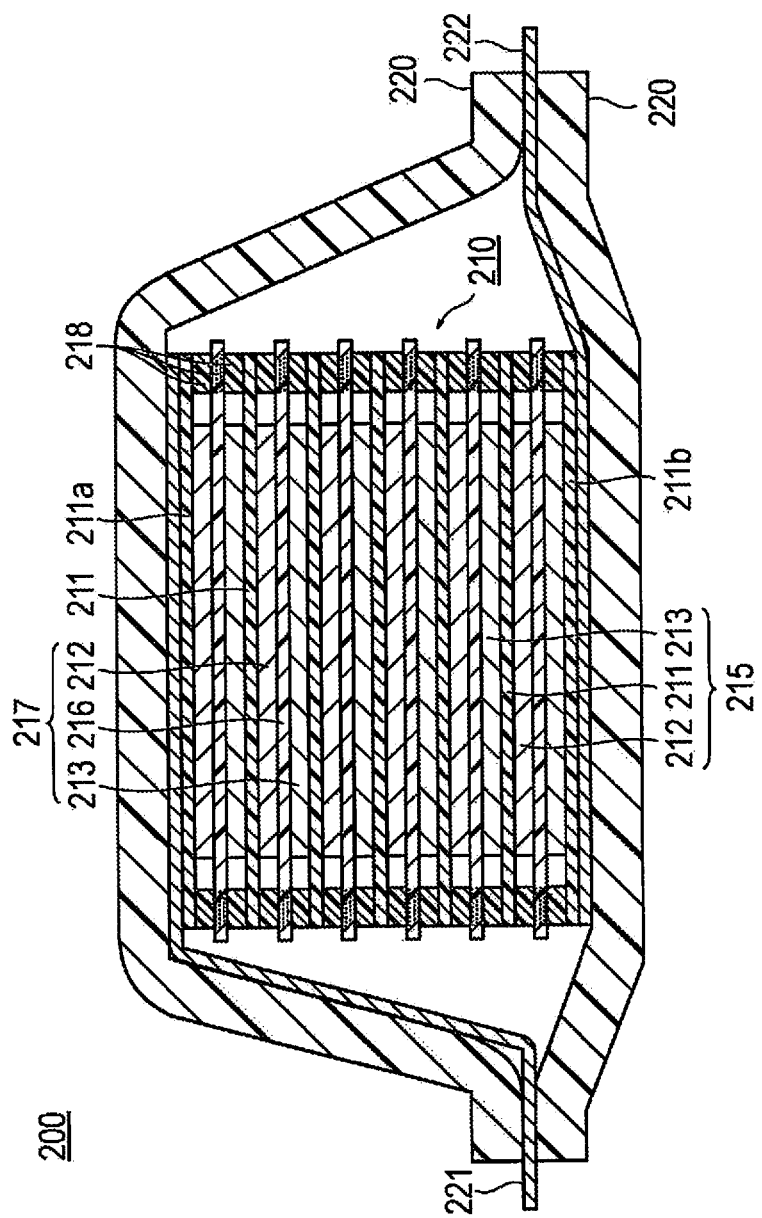
FIG. 2 is a schematic cross-sectional view schematically illustrating a basic configuration of a secondary battery.

Next, the secondary battery 200 for which an internal short circuit is detected with the short circuit detection device 100 will be described with reference to FIG. 2. FIG. 2 is a schematic cross-sectional view schematically illustrating a basic configuration of the secondary battery 200. The secondary battery 200 according to the present embodiment is a bipolar secondary battery. In the bipolar secondary battery 200, an essentially rectangular power-generating element 210 in which a charge/discharge reaction actually proceeds is sealed inside a laminate film 220, which is battery exterior material.

As shown in FIG. 2, the power-generating element 210 of the bipolar secondary battery 200 includes a plurality of bipolar electrodes 215, configured with a positive electrode active material layer 212 formed on one surface of a current collector 211 and a negative electrode active material layer 213 formed on the other surface of the current collector 211. Each of the bipolar electrodes 215 is stacked via an electrolyte layer 216 to form the power-generating element 210. The electrolyte layer 216 has a configuration in which an electrolyte is held in the central portion in the planar direction of a separator serving as a base material. At this time, the bipolar electrodes 215 and the electrolyte layers 216 are alternately stacked such that the positive electrode active material layer 212 of one bipolar electrode 215 and the negative electrode active material layer 213 of another bipolar electrode 215 adjacent to the one bipolar electrode 215 oppose each other via the electrolyte layer 216. That is, the electrolyte layer 216 is disposed sandwiched between the positive electrode active material layer 212 of one bipolar electrode 215 and the negative electrode active material layer 213 of another bipolar electrode 215 adjacent to the one bipolar electrode 215.

The positive electrode active material layer 212, the electrolyte layer 216, and the negative electrode active material layer 213, which are adjacent to each other, constitute one unit cell layer 217. Thus, it can be said that the bipolar secondary battery 200 has a structure of stacked unit cell layers 217. In addition, a seal portion 218 is disposed at an outer peripheral portion of the unit cell layer 217 for the purpose of preventing liquid junctions due to leakage of electrolytic solution from the electrolyte layer 216. The positive electrode active material layer 212 is formed on only one side of a positive electrode-side outermost layer current collector 211a positioned at the outermost layer of the power-generating element 210. In addition, the negative electrode active material layer 213 is formed on only one side of a negative electrode-side outermost layer current collector 211b positioned at the outermost layer of the power-generating element 210. However, the positive electrode active material layer 212 may be formed on both sides of the positive electrode-side outermost layer current collector 211a. Similarly, the negative electrode active material layer 213 may be formed on both sides of the negative electrode-side outermost layer current collector 211b.

Moreover, in the bipolar secondary battery 200, a positive electrode collector plate 221 is disposed so as to be adjacent to the positive electrode-side outermost layer current collector 211a and is extended and drawn out from the laminate film 220. A negative electrode collector plate 222, on the other hand, is disposed so as to be adjacent to the negative electrode-side outermost layer current collector 211b and is similarly extended and drawn out from the laminate film 220. The voltage sensor 110 of the short circuit detection device 100 detects the voltage between the positive and negative electrode collector plates 221, 222, respectively, that are drawn out from the laminate film 220 as the cell voltage of the secondary battery 200.

The number of stacked unit cell layers 217 is adjusted in accordance with the desired voltage. In addition, in the bipolar secondary battery 200, the number of stacked unit cell layers 217 can be reduced as long as sufficient output can be ensured even if the battery is made as thin as possible.

If a mechanical shock is applied to such a secondary battery 200 from the outside, then there are cases in which an internal short circuit may occur to the secondary battery 200. The short circuit detection device 100 of the present embodiment detects in real time the internal short circuit that occurs in the secondary battery 200 that is discharging to a load 300. The operation of the short circuit detection device 100 will be described in detail below with reference to FIG. 3.

Figure 3:
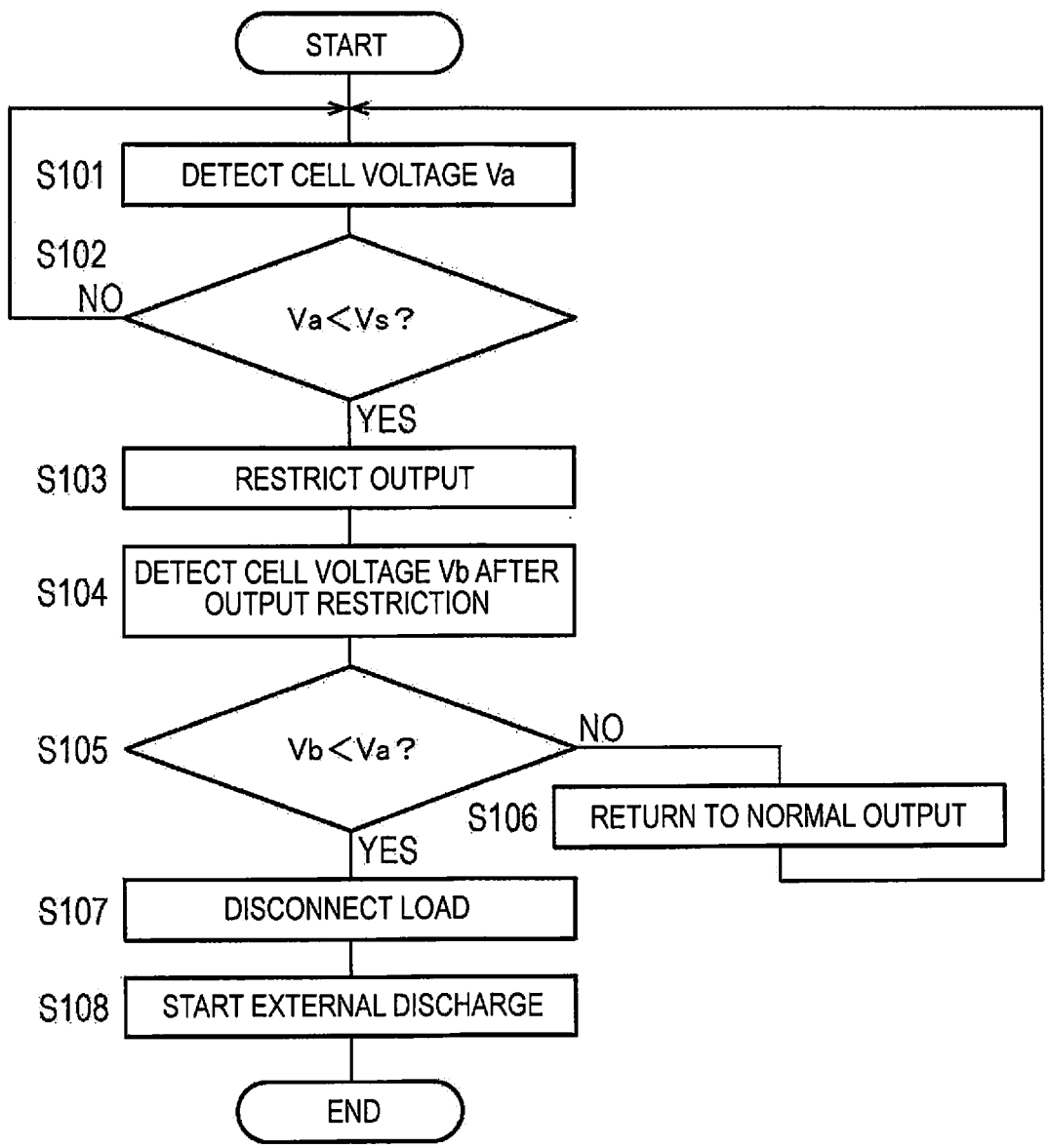
FIG. 3 is a flow chart illustrating a procedure of a short circuit detection process executed by the short circuit detection device.

FIG. 3 is a flow chart illustrating a procedure of a short circuit detection process executed by the short circuit detection device 100. When the short circuit detection process is started, the first switch 140a between the secondary battery 200 and the external resistor 130 is in the OFF state and the second switch 140b between the secondary battery 200 and the load 300 is in the ON state.

As shown in FIG. 3, first, the short circuit detection device 100 detects a voltage value Va of the discharging secondary battery 200 (Step S101). More specifically, the voltage sensor 110 detects, as a first voltage value Va, the cell voltage of the secondary battery 200 discharging to the load 300. The first voltage value Va detected by the voltage sensor 110 is transmitted to the control unit 150.

The short circuit detection device 100 then determines whether the voltage value Va of the secondary battery 200 is below a threshold value Vs (Step S102). More specifically, the control unit 150 determines whether the first voltage value Va detected in the process of Step S101 is below a prescribed threshold value Vs. Here, the threshold value Vs is an appropriately set voltage value that serves as a reference when the process for determining whether an internal short circuit has occurred in the secondary battery 200 is started. If the secondary battery 200 is a lithium-ion secondary battery, the threshold value Vs is a voltage value corresponding to, for example, 2.5 V with respect to a cell voltage of 4.2V of the unit cell layer in a fully-charged state, and is set in accordance with the number of the stacked unit cell layers.

If it is determined that the voltage value Va of the secondary battery 200 is not below the threshold value Vs (Step S102: NO), then the short circuit detection device 100 returns to the process of Step S101.

If, on the other hand, it is determined that the voltage value Va of the secondary battery 200 is below the threshold value Vs (Step S102: YES), then the short circuit detection device 100 adjusts the load 300 and restricts the output of the secondary battery 200 (Step S103). More specifically, the control unit 150, for example, reduces the rotational speed of a motor, which is the load 300, to reduce the current that flows from the secondary battery 200 to the load 300. As a result, the magnitude of the current that flows from the secondary battery 200 to the load 300 decreases from a first current value Ia to a second current value Ib.

The short circuit detection device 100 then detects a voltage value Vb of the secondary battery 200 after the load adjustment (step S104). More specifically, the voltage sensor 110 detects the cell voltage of the secondary battery 200 discharging to the load 300, which is adjusted in the process shown in Step S103, as the second voltage value Vb. The second voltage value Vb detected by the voltage sensor 110 is transmitted to the control unit 150.

The short circuit detection device 100 then determines whether the voltage value Vb is less than the voltage value Va (Step S105). More specifically, the control unit 150 determines whether the second voltage value Vb detected in the process shown in Step S104 is less than the first voltage value Va detected in the process shown in Step S101.

If it is determined that the voltage value Vb is not less than the voltage value Va (Step S105: NO), the short circuit detection device 100 returns the output of the secondary battery 200 to the normal output (Step S106) and returns to the process of Step S101. More specifically, the control unit 150 determines that the cause of the cell voltage of the secondary battery 200 falling below the threshold value Vs is attributable to an increase in the internal resistance (overvoltage) of the secondary battery 200 and that an internal short circuit of the secondary battery 200 has not occurred. Then, the control unit 150 returns the load 300, which was adjusted in the process shown in Step S103, to the state before the adjustment to increase the current that flows from the secondary battery 200 to the load 300. As a result, the magnitude of the current that flows from the secondary battery 200 to the load 300 recovers from the second current value Ib to the first current value Ia.

If, on the other hand, it is determined that the voltage value Vb is less than the voltage value Va (Step S105: YES), then the short circuit detection device 100 disconnects the load 300 (Step S107). More specifically, the control unit 150 determines that the cause of the cell voltage of the secondary battery 200 falling below the threshold value Vs is attributable to an internal short circuit of the secondary battery 200 and that an internal short circuit of the secondary battery 200 has occurred. The control unit 150 then controls the second switch 140b to electrically disconnect the load 300 from the secondary battery 200.

The short circuit detection device 100 then starts an external discharge (Step S108) and ends the process. More specifically, the control unit 150 controls the first switch 140a and electrically connects the external resistor 130 to the secondary battery 200. When the external resistor 130 is connected to the secondary battery 200, the electric power from the secondary battery 200 is consumed by the external resistor 130, and the electric power from the secondary battery 200 is discharged by the external resistor 130.

As described above, by means of the process of the flow chart shown in FIG. 3, if the voltage value Va of the secondary battery 200 falls below the threshold value Vs, the load 300 is adjusted and the current that flows from the secondary battery 200 to the load 300 is reduced. Then, if the voltage value Vb of the secondary battery 200 after the load adjustment is less than the voltage value Va of the secondary battery 200 before the load adjustment, it is recognized that the secondary battery has an internal short circuit, and the external discharge of the secondary battery 200 is performed.

As described above, in the case that the cause of the cell voltage of the secondary battery 200 falling below the threshold value Vs is attributable to an increase in the internal resistance, when the current flow from the secondary battery 200 to the load 300 is reduced, the voltage loss due to the internal resistance decreases and the cell voltage of the secondary battery 200 increases. On the other hand, in the case that the cause of the cell voltage of the secondary battery 200 falling below the threshold value Vs is attributable to an internal short circuit, even if the current that flows from the secondary battery 200 to the load 300 is reduced, the cell voltage of the secondary battery 200 decreases without increasing. In the short circuit detection device 100 according to the present embodiment, an internal short circuit of the secondary battery 200 is detected utilizing this phenomenon.

Then, in the short circuit detection device 100 according to the present embodiment, it is determined whether an internal short circuit has occurred in the secondary battery 200 in a state in which the internal resistance of the secondary battery 200 hardly changes. As a result, by means of the short circuit detection device 100 according to the present embodiment, the internal short circuit of the secondary battery 200 can be accurately detected even in a system in which a fluctuating discharge occurs. Accordingly, it is possible to accurately detect in real time the internal short circuit of the secondary battery 200, regardless of the mode of use of the secondary battery 200.

As described above, the present embodiment exhibits the following effects.

(a) Since it is determined whether an internal short circuit has occurred in the secondary battery 200 regardless of the internal resistance of the secondary battery 200, it is possible to accurately detect in real time the internal short circuit of the secondary battery 200 regardless of the mode of use of the secondary battery 200. In addition, since a voltage drop caused by an internal short circuit and a voltage drop caused by an increase in the internal resistance are distinguished, it is possible to more accurately detect an internal short circuit of the secondary battery 200.

(b) If an internal short circuit of the secondary battery 200 is detected, the secondary battery 200 is disconnected from the load 300 and an external discharge is carried out; therefore, the safety of the secondary battery 200 is further enhanced.

(c) Since an internal short circuit of the bipolar secondary battery 200 is detected, the practicality of the apparatus (electric vehicle, etc.) driven by the bipolar secondary battery 200 is improved.

Second Embodiment

The second embodiment of the present invention will now be described with reference to FIGS. 4 and 5. In the present embodiment, the amount of change in the cell voltage of the secondary battery 200 per unit time is calculated in order to detect an internal short circuit.

Figure 4:
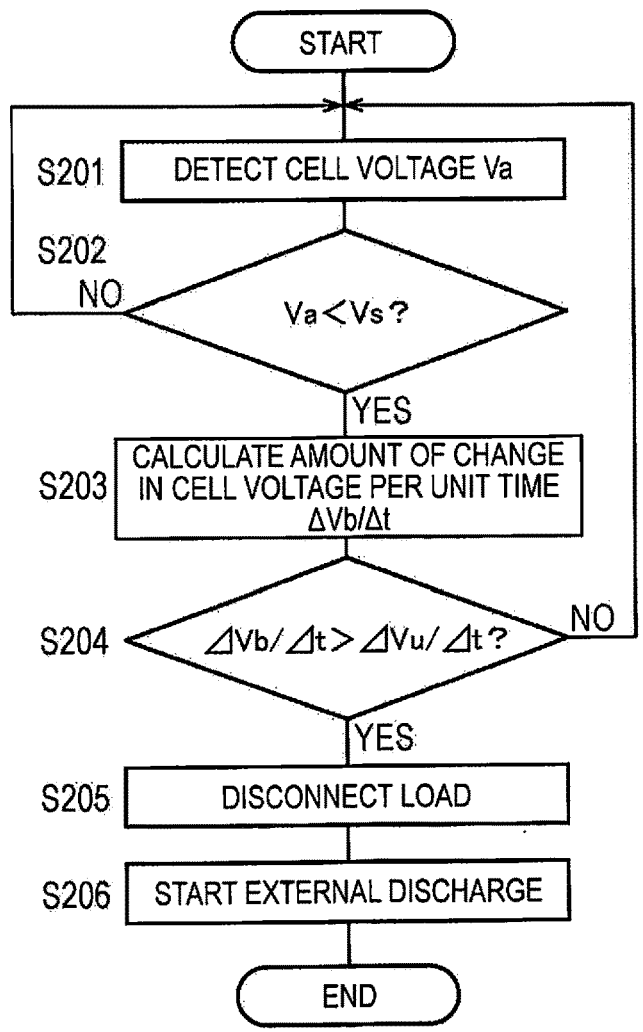
FIG. 4 is a flow chart illustrating the procedure of the short circuit detection process according to a second embodiment.

FIG. 4 is a flow chart illustrating the procedure of the short circuit detection process according to the present embodiment. Except for a different process of detecting an internal short circuit, the configuration itself of the short circuit detection device 100 according to the present embodiment is the same as that in the first embodiment, so that a description of the configuration of the short circuit detection device 100 will be omitted.

In addition, by means of the CPU executing a corresponding program, the control unit 150 of the short circuit detection device 100 according to the present embodiment functions as a first determination unit, a change amount detection unit, a second determination unit, and a recognition unit. The first determination unit determines whether a voltage value, obtained by detecting with the voltage sensor 110 the cell voltage of the secondary battery 200 that is discharging to the load 300, is below a first threshold value. If it is determined that the voltage value is below the first threshold value, the change amount detection unit calculates the amount of change in the cell voltage of the secondary battery 200 per unit time. The second determination unit determines whether the amount of change in the cell voltage of the secondary battery 200 per unit time exceeds a second threshold value. If it is determined that the amount of change in the cell voltage of the secondary battery 200 per unit time exceeds the second threshold value, the recognition unit recognizes that the secondary battery 200 has an internal short circuit.

As shown in FIG. 4, in the short circuit detection process according to the present embodiment, the short circuit detection device 100 first detects the voltage value Va of the discharging secondary battery 200 (Step S201). More specifically, the voltage sensor 110 detects the cell voltage of the secondary battery 200 discharging to the load 300 as the voltage value Va.

The short circuit detection device 100 then determines whether the voltage value Va of the secondary battery 200 is below the first threshold value Vs (Step S202). More specifically, the control unit 150 determines whether the first voltage value Va detected in the process shown in Step S201 is below the prescribed first threshold value Vs. Here, the first threshold value Vs is an appropriately set voltage value that serves as a reference when a process for determining whether the internal short circuit has occurred in the secondary battery 200 is initiated. In the case that the secondary battery 200 is a lithium-ion secondary battery, the threshold value Vs is a voltage value corresponding to, for example, 2.5 V with respect to a cell voltage of 4.2V of the unit cell layer in a fully-charged state and is set in accordance with the number of the stacked unit cell layers.

If it is determined that the voltage value Va of the secondary battery 200 is not below the first threshold value Vs (Step S202: NO), then the short circuit detection device 100 returns to the process of Step S201.

If, on the other hand, it is determined that the voltage value Va of the secondary battery 200 is below the first threshold value Vs (Step S202: YES), then the short circuit detection device 100 calculates the amount of change in the cell voltage per unit time $\Delta Vb/\Delta t$ (Step S203). More specifically, the control unit 150 calculates the amount of change in the cell voltage per unit time $\Delta Vb/\Delta t$ from the change in the value of the cell voltage periodically detected by the voltage sensor 110.

The short circuit detection device 100 then determines whether the amount of change in the cell voltage per unit time $\Delta Vb/\Delta t$ exceeds a second threshold value $\Delta Vu/\Delta t$ (step S204). More specifically, the control unit 150 determines whether the amount of change in the cell voltage per unit time $\Delta Vb/\Delta t$ calculated in the process of Step S203 exceeds the prescribed second threshold value $\Delta Vu/\Delta t$. Here, the second threshold value $\Delta Vu/\Delta t$ is appropriately set to distinguish between a voltage drop of the secondary battery 200 due to an internal short circuit and a normal voltage drop of the secondary battery 200. In the case that the secondary battery 200 is a lithium-ion secondary battery, the second threshold value $\Delta Vu/\Delta t$ is a value corresponding to, for example, 2 V/sec with respect to a cell voltage of 4.2V of the unit cell layer in the fully-charged state and is set in accordance with the number of the stacked unit cell layers.

If it is determined that the amount of change in the cell voltage $\Delta Vb/\Delta t$ does not exceed the second threshold value $\Delta Vu/\Delta t$ (Step S204: NO), then the short circuit detection device 100 determines that an internal short circuit of the secondary battery 200 has not occurred and returns to the process of Step S201.

If, on the other hand, it is determined that the amount of change in the cell voltage $\Delta Vb/\Delta t$ exceeds the second threshold value $\Delta Vu/\Delta t$ (Step S204: YES), then the short circuit detection device 100 determines that an internal short circuit of the secondary battery 200 has occurred and disconnects the load 300 (Step S205). The process after Step S205 is the same as the process after Step S107 in FIG. 3, so that a description of the process after Step S205 will be omitted.

As described above, by means of the process of the flow chart shown in FIG. 4, if the voltage value Va of the secondary battery 200 falls below the first threshold value Vs, the amount of change in the cell voltage of the secondary battery 200 per unit time is calculated. Then, if the amount of change in the cell voltage per unit time $\Delta Vb/\Delta t$ exceeds the second threshold value $\Delta Vu/it$, it is recognized that an internal short circuit of the secondary battery 200 has occurred, and the external discharge of the secondary battery 200 is performed.

The short circuit detection process according to the present embodiment will now be described in more detail with reference to FIG. 5.

Figure 5:
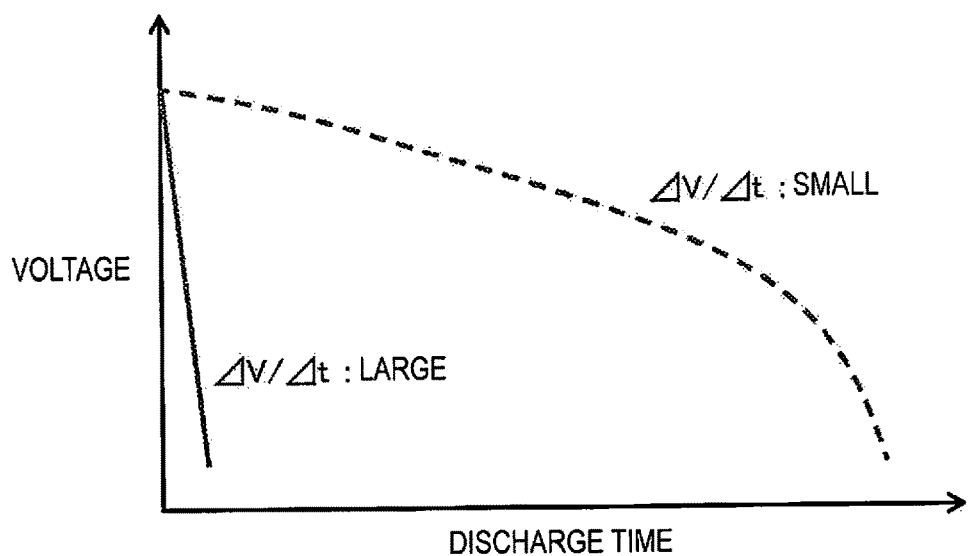
FIG. 5 is an explanatory view of the short circuit detection process according to the second embodiment.

FIG. 5 is a view showing one example of the relationship between time and the cell voltage of the secondary battery 200 during discharge. The vertical axis in FIG. 5 represents the cell voltage of the secondary battery 200, and the horizontal axis represents time. The solid line in FIG. 5 indicates the time profile of the cell voltage of the secondary battery 200 when an internal short circuit occurs at the time of a specific current output. The broken line in FIG. 5 indicates the normal time profile of the cell voltage of the secondary battery 200 at the time of a specific current output.

As shown in FIG. 5, there is a great difference between the voltage change with respect to the discharge time for normal operation and the occurrence of an internal short circuit. Specifically, the cell voltage under normal circumstances decreases slowly over time, whereas the cell voltage at the time of the occurrence of a short circuit drops greatly in a short period of time. In the case of an increasing overvoltage with an increase in the internal resistance of the secondary battery 200, the voltage profile indicated by the broken line shifts downward as the charging and discharging are repeated a plurality of times.

By using the above-described phenomenon, the short circuit detection device 100 according to the present embodiment detects an internal short circuit of the secondary battery 200 by comparing the amount of change in the cell voltage of the secondary battery 200 per unit time $\Delta Vb/\Delta t$ with the prescribed second threshold value $\Delta Vu/\Delta t$. By means of such a configuration, an internal short circuit of the secondary battery 200 can be accurately detected.

Modifications

In the above-described embodiment, a fixed value is used as the second threshold value. However, the second threshold value may be a variable value. In this case, a conversion table indicating the relationship between the electric current value of the secondary battery 200 and the second threshold value is registered in the control unit 150 in advance, and the second threshold value is changed in accordance with the magnitude of the current that flows from the secondary battery 200 to the load 300. By means of such a configuration, an internal short circuit of the secondary battery 200 can be more accurately detected.

In addition, in the embodiment described above, if the cell voltage of the secondary battery 200 is determined to be below the first threshold value Vs in the process shown in Step S202 of FIG. 4, the amount of change in the cell voltage of the secondary battery 200 per unit time is calculated. However, the process shown in Steps S201-S202 of FIG. 4 may be omitted. In this case, the amount of change $\Delta Vb/\Delta t$ in the cell voltage of the secondary battery 200 per unit time is periodically calculated and compared with the prescribed second threshold value $\Delta Vu/\Delta t$.

In addition to the effects of the first embodiment, the present embodiment described above exhibits the following effect.

(d) Since the internal short circuit of the secondary battery 200 is detected based on the amount of change of the secondary battery 200 per unit time, the internal short circuit can be detected in a shorter period of time compared to a case in which the internal short circuit is detected by adjusting the load 300.

Third Embodiment

The third embodiment of the present invention will now be described with reference to FIGS. 6 and 7. In the present embodiment, an internal short circuit that indicates behavior in which the cell voltage varies with time is detected.

Figure 6:
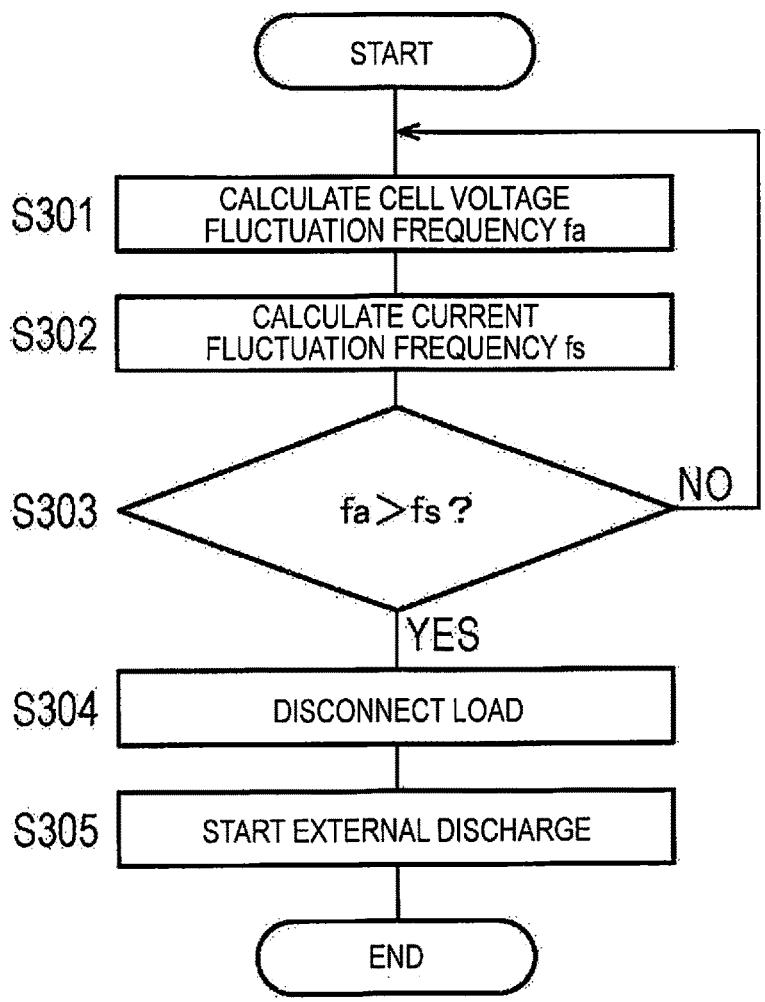
FIG. 6 is a flow chart illustrating the procedure of the short circuit detection process according to a third embodiment.

FIG. 6 is a flow chart illustrating the procedure of the short circuit detection process according to the present embodiment. Except for a different process of detecting an internal short circuit, the configuration itself of the short circuit detection device 100 according to the present embodiment is the same as that in the first embodiment, so that a description of the configuration of the short circuit detection device 100 will be omitted.

In addition, by means of the CPU executing a corresponding program, the control unit 150 of the short circuit detection device 100 according to the present embodiment functions as a first frequency calculation unit, a second frequency calculation unit, a determination unit, and a recognition unit. The first frequency calculation unit calculates a cell voltage fluctuation frequency of the secondary battery 200 during discharge to the load 300. The second frequency calculation unit calculates the fluctuation frequency of the current that flows from the secondary battery 200 to the load 300. The determination unit determines whether the cell voltage fluctuation frequency is greater than the current fluctuation frequency. When it is determined that the cell voltage fluctuation frequency is higher than the current fluctuation frequency, the recognition unit recognizes that the secondary battery 200 has an internal short circuit.

As shown in FIG. 6, in the short circuit detection process according to the present embodiment, the short circuit detection device 100 first calculates a cell voltage fluctuation frequency fa (Step S301). More specifically, the control unit 150 carries out a frequency analysis (for example, a fast Fourier transform) of the cell voltage detected by the voltage sensor 110 to calculate the cell voltage fluctuation frequency fa of the secondary battery 200.

The short circuit detection device 100 then calculates a fluctuation frequency fs of the current that flows from the secondary battery 200 to the load 300 (step S302). More specifically, the control unit 150 carries out a frequency analysis of the electric current value detected by the current sensor 120 to calculate the fluctuation frequency fs of the current that flows from the secondary battery 200 to the load 300.

The short circuit detection device 100 then determines whether the cell voltage fluctuation frequency fa is greater than the current fluctuation frequency fs (Step S303). More specifically, the control unit 150 determines whether the cell voltage fluctuation frequency fa calculated in the process shown in Step S301 is greater than the current fluctuation frequency fs calculated in the process shown in Step S302.

If it is determined that the cell voltage fluctuation frequency fa is not greater than the current fluctuation frequency fs (Step S303: NO), the short circuit detection device 100 determines that an internal short circuit of the secondary battery 200 has not occurred and returns to the process of Step S301.

If, on the other hand, it is determined that the cell voltage fluctuation frequency fa is greater than the current fluctuation frequency fs (Step S303: YES), the short circuit detection device 100 determines that an internal short circuit of the secondary battery 200 has occurred and disconnects the load 300 (Step S304). The process after Step S304 is the same as the process after Step S107 in FIG. 3, so that a description of the process after Step S304 will be omitted.

As described above, by means of the process of the flow chart shown in FIG. 6, the cell voltage fluctuation frequency fa of the secondary battery 200 is compared with the fluctuation frequency fs of the current that flows out from the secondary battery 200. Then, if the cell voltage fluctuation frequency fa is greater than the current fluctuation frequency fs, it is recognized that an internal short circuit of the secondary battery 200 has occurred, and the external discharge of the secondary battery 200 is carried out.

The short circuit detection process according to the present embodiment will now be described in more detail with reference to FIG. 7.

Figure 7:
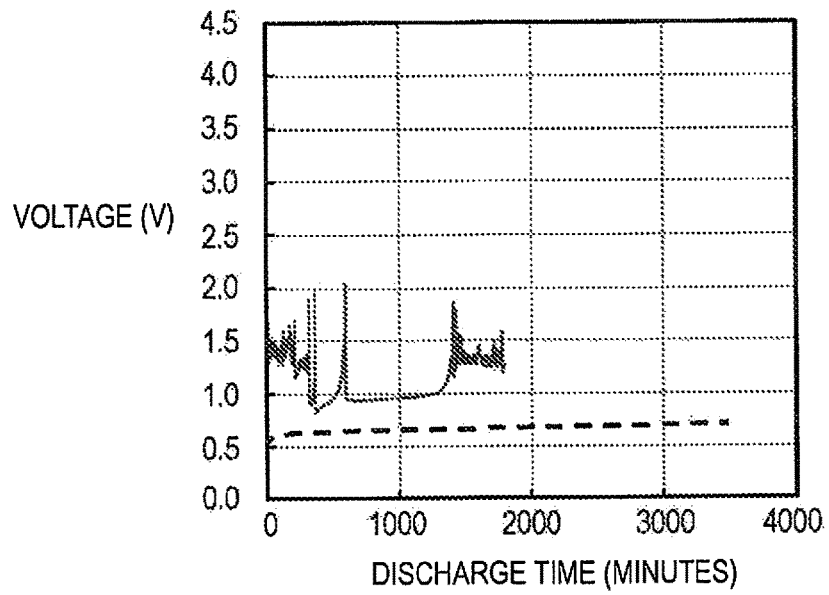
FIG. 7 is an explanatory view of the short circuit detection process according to the third embodiment.

FIG. 7 is a view showing one example of the relationship between time and the cell voltage of the secondary battery 200 during discharged. The vertical axis in FIG. 7 represents the cell voltage of the secondary battery 200, and the horizontal axis represents time. The solid line in FIG. 7 indicates a time profile of the cell voltage of the secondary battery 200 in which an internal short circuit that indicates behavior in which the cell voltage varies with time has occurred. The broken line in FIG. 7 indicates a time profile of the cell voltage of the secondary battery 200 in which a general internal short circuit has occurred.

As shown in FIG. 7, when the secondary battery 200 is internally short-circuited, the cell voltage sometimes exhibits the behavior indicated by the solid line. In such a case, the cell voltage fluctuates in a short cycle of about 1 Hz to 2 kHz. At this time, the current that flows from the secondary battery 200 to the load 300 does not follow the fluctuation of the cell voltage, and the current fluctuation frequency becomes lower than the cell voltage fluctuation frequency. The short circuit detection device 100 according to the present embodiment utilizes this phenomenon, and, by comparing the cell voltage fluctuation frequency with the current fluctuation frequency, detects an internal short circuit exhibited by the behavior of the cell voltage indicated by the solid line.

An internal short circuit that is not accompanied by the fluctuation in the cell voltage indicated by the broken line can be detected by the short circuit detection process of the first or the second embodiment.

In addition to the effects of the first and second embodiments, the present embodiment described above exhibits the following effect.

(e) By comparing the cell voltage fluctuation frequency of the secondary battery 200 with the current fluctuation frequency, an internal short circuit of the secondary battery 200 which exhibits behavior in which the cell voltage fluctuates with time can be detected.

The short circuit detection device 100 of the present invention was described in the first to the third embodiments described above. However, it goes without saying that a person skilled in the art can make suitable additions, modifications, or omissions to the present invention within the scope of the technical concept thereof.

For example, in the first to the third embodiments described above, if the control unit 150 of the short circuit detection device 100 recognizes that an internal short circuit of the secondary battery 200 has occurred, the secondary battery 200 is disconnected from the load 300, and an external discharge is performed. However, once the internal short circuit of the secondary battery 200 is recognized, the process of disconnecting the load 300 and carrying out the external discharge can be omitted.

In addition, in the first to the third embodiments described above, cases in which various processes are achieved by the execution of programs by the CPU of the control unit 150 were described by way of example. However, the various processes in the short circuit detection device 100 may be realized by dedicated hardware circuits.

Additionally, in the first to the third embodiments described above, cases in which an internal short circuit of a bipolar secondary battery in which unit cell layers are connected in series is detected were described by way of example. However, the present invention can be applied to a general secondary battery in which the unit cell layers are connected in parallel.

In addition, the third embodiment described above can be executed in combination with the first or the second embodiment. For example, when the first embodiment and the third embodiment are combined, the processes of the flow charts of FIG. 3 and FIG. 6 are alternately executed. Similarly, for example, when the second embodiment and the third embodiment are combined, the processes of the flow charts of FIG. 4 and FIG. 6 are alternately executed.

The invention claimed is:

1. A short circuit detection device comprising:
    a voltage sensor that detects a voltage of a secondary battery;
    a first determination unit that determines whether a first voltage value obtained by detecting a voltage of the secondary battery that is discharging to a load with the voltage sensor is below a threshold value;
    a load adjustment unit that adjusts the load to reduce current that flows from the secondary battery to the load upon determining the first voltage value is below the threshold value;
    a second determination unit that determines whether a second voltage value obtained by detecting a voltage of the secondary battery after load adjustment with the voltage sensor is less than the first voltage value; and a recognition unit that recognizes an internal short circuit of the secondary battery upon determining the second voltage value is less than the first voltage value.

2. The short circuit detection device according to claim 1, further comprising
   a first frequency calculation unit that detects the voltage of the secondary battery discharging to the load with the voltage sensor and calculates a voltage fluctuation frequency,
   a current sensor that detects current that flows from the secondary battery to the load,
   a second frequency calculation unit that detects with the current sensor the current flow and calculates a current fluctuation frequency,
   a third determination unit that determines whether the voltage fluctuation frequency is greater than the current fluctuation frequency, and
   a second recognition unit that recognizes an internal short circuit of the secondary battery upon determining that the voltage fluctuation frequency is greater than the current fluctuation frequency.

3. The short circuit detection device according to claim 1, further comprising
   an external resistor that is connected to the secondary battery and that discharges electric power from the secondary battery, and
   a switch that disconnects the secondary battery from the load and connects the secondary battery to the external resistor upon recognizing an internal short circuit of the secondary battery.

4. The short circuit detection device according to claim 1, wherein
   the secondary battery is a bipolar secondary battery comprising a power-generating element formed by stacking electrolyte layers and bipolar electrodes, in which a positive electrode active material layer is formed on one surface of a current collector and a negative electrode active material layer is formed on the other surface of the current collector.

5. A short circuit detection device comprising:
   a voltage sensor that detects a voltage of a secondary battery;
   a first frequency calculation unit that detects the voltage of the secondary battery that is discharging to a load with the voltage sensor and calculates a voltage fluctuation frequency;
   a current sensor that detects current that flows from the secondary battery to the load;
   a second frequency calculation unit that detects the current flow with the current sensor and calculates a current fluctuation frequency;
   a determination unit that determines whether the voltage fluctuation frequency is greater than the current fluctuation frequency; and
   a recognition unit that recognizes an internal short circuit of the secondary battery upon determining that the voltage fluctuation frequency is greater than the current fluctuation frequency.

* * * * *